US011825006B2

(12) United States Patent
Cheng et al.

(10) Patent No.: US 11,825,006 B2
(45) Date of Patent: Nov. 21, 2023

(54) ELECTRONIC DEVICE AND FUNCTION MODULE THEREOF

(71) Applicant: ASUSTeK COMPUTER INC., Taipei (TW)

(72) Inventors: Chia-Min Cheng, Taipei (TW);
Chui-Hung Chen, Taipei (TW);
Ching-Yuan Yang, Taipei (TW);
Cheng-Han Chung, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 296 days.

(21) Appl. No.: 17/230,188

(22) Filed: Apr. 14, 2021

(65) Prior Publication Data

US 2021/0329111 A1 Oct. 21, 2021

(30) Foreign Application Priority Data

Apr. 21, 2020 (TW) .................... 109113284

(51) Int. Cl.
*H04M 1/02* (2006.01)
*H05K 1/18* (2006.01)
*H04N 5/225* (2006.01)
*H04N 23/57* (2023.01)

(52) U.S. Cl.
CPC .......... *H04M 1/0264* (2013.01); *H04N 23/57* (2023.01); *H05K 1/189* (2013.01)

(58) Field of Classification Search
CPC ............ H04M 1/0264; H04M 2250/20; H04N 23/57; H05K 1/147; H05K 1/189; H05K 2201/10121

USPC ............................................ 455/575.1, 575.6
See application file for complete search history.

(56) References Cited

U.S. PATENT DOCUMENTS

| 2017/0338639 | A1  | 11/2017 | Liu et al. |            |
|--------------|-----|---------|------------|------------|
| 2019/0014201 | A1* | 1/2019  | Bao        | H04N 23/698 |
| 2020/0329130 | A1* | 10/2020 | Choi       | H04M 1/0237 |
| 2021/0014346 | A1* | 1/2021  | Choi       | H04M 1/0277 |
| 2021/0360096 | A1* | 11/2021 | Chung      | G06F 1/1686 |

FOREIGN PATENT DOCUMENTS

| CN | 206100230 U   |   | 4/2017  |            |
|----|---------------|---|---------|------------|
| EP | 1469672 A1    |   | 10/2004 |            |
| EP | 3340586       | * | 12/2016 | H04M 1/02  |
| EP | 3396933       | * | 4/2017  | H04M 1/02  |
| EP | 3972229       | * | 5/2019  | H04M 1/02  |
| JP | 2016139651 A  |   | 8/2016  |            |
| KR | 1020060061040 A | | 6/2006  |            |

* cited by examiner

*Primary Examiner* — Tan H Trinh
(74) *Attorney, Agent, or Firm* — McClure, Qualey & Rodack, LLP

(57) ABSTRACT

The invention discloses an electronic device. The electronic device comprises a body and a function module. The function module is rotatably disposed in the body, and includes a housing, a function component and a rigid-flex circuit board. The housing includes a shaft portion. The shaft portion is engaged to the body. The function component and the rigid-flex circuit board are disposed in the housing. The rigid-flex circuit board includes a rigid board portion and at least a flexible board portion. The rigid board portion is electrically connected to the function component. The flexible board portion is connected to the rigid board portion. The flexible board portion passes through the shaft portion and extends into the body.

10 Claims, 7 Drawing Sheets

ELECTRONIC DEVICE AND FUNCTION MODULE THEREOF

CROSS-REFERENCE TO RELATED APPLICATION

This application claims the priority benefit of TW application serial No. 109113284, filed on Apr. 21, 2020. The entirety of the above-mentioned patent application is hereby incorporated by references herein and made a part of specification.

BACKGROUND OF THE INVENTION

Field of the Invention

The disclosure relates to an electronic device and a function module thereof.

Description of the Related Art

In recent years, various solutions, such as a reversible camera, are proposed for full-screen smart phones.

BRIEF SUMMARY OF THE INVENTION

According to first aspect of the disclosure, a function module for an electronic device is provided. The function module comprises: a housing, including a shaft portion; a function component, disposed at the housing; and a rigid-flex circuit board, disposed in the housing, the rigid-flex circuit board including: a rigid board portion, electrically connected to the function component; and at least a flexible board portion, connected to the rigid board portion, passing through the shaft portion and extending to outside of the housing.

According to second aspect of the disclosure, an electronic device is provided. The electronic device comprises a body; and a function module, rotatably disposed in the body, the function module including a housing, including a shaft portion, the shaft portion engaged to the body; a function component, disposed at the housing; and a rigid-flex circuit board, disposed in the housing, the rigid-flex circuit board including: a rigid board portion, electrically connected to the function component; and at least a flexible board portion, connected to the rigid board portion, and passing through the shaft portion and extending into the body.

The function module of the electronic device includes the rigid-flex circuit board used as the transferring component between the function component and the mainboard of the electronic device. The rigid-flex circuit board occupies less space. It is beneficial to decrease the volume of the function module. Moreover, since the rigid-flex circuit board is configured as the transferring component, lines of the function component out of the function module do not need to be dragged out to be connected to the mainboard. Therefore, the function component is not easily damaged due to the rotation of the function module.

BRIEF DESCRIPTION OF THE DRAWINGS

In order to make the above and other objectives, features, advantages and embodiments of the present disclosure more obvious and understandable, the description of the accompanying drawings is as follows.

DETAILED DESCRIPTION OF THE EMBODIMENTS

These and other features, aspects, and advantages of the disclosure will become better understood with regard to the following description, appended claims, and accompanying drawings. The components shown in figures are not used for limit the size or the proportion. Embodiments are illustrated with figures but not used to limit the scope of the invention. The invention will be better understood with the embodiments hereinafter.

Figure 1:
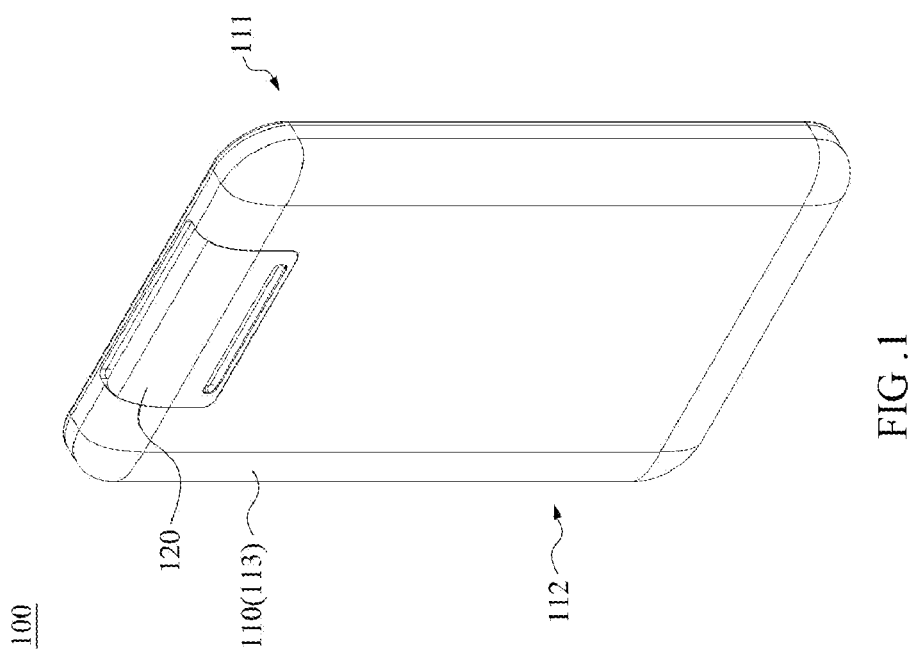
FIG. 1 and FIG. 2 are perspective views showing an electronic device in two different operating states according to an embodiment of the disclosure.
Figure 2:
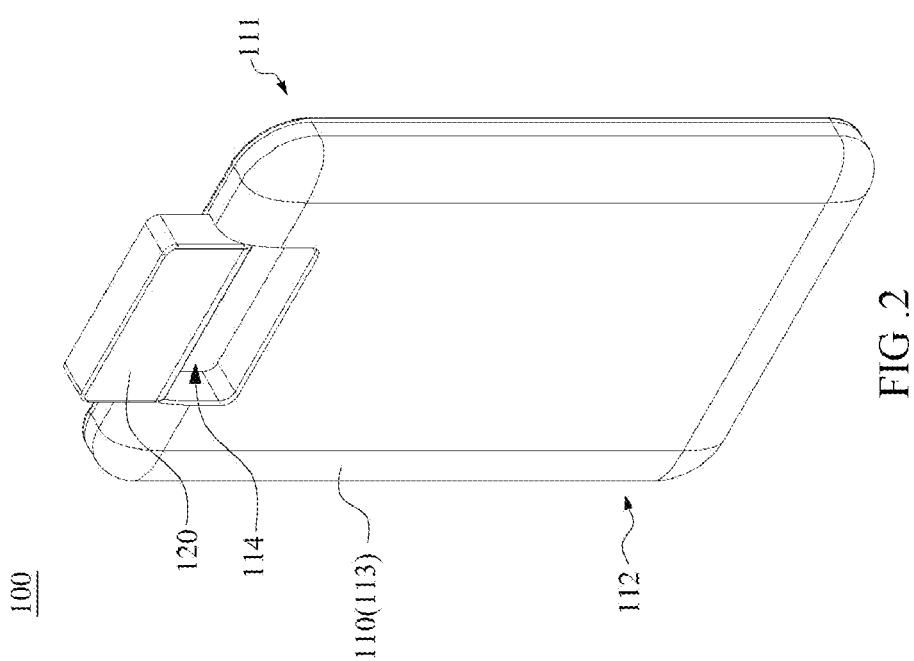

Please refer to FIG. 1 and FIG. 2. An electronic device 100 includes a body 110 and a function module 120. The body 110 includes a first side 111 and a second side 112 opposite to each other. In an embodiment, a display screen (not shown) is disposed on the first side 111. The function module 120 is rotatably disposed at the second side 112 of the body 110. In an embodiment, the body 110 includes a cover 113. The cover 113 includes a slot 114. The function module 120 is accommodated in the slot 114.

In some embodiments, the function module 120 rotates between a first position shown in FIG. 1 (that is, the function module 120 is in the slot 114) and a second position shown in FIG. 2 ((that is, the function module 120 extends from a side of the body 110). In an embodiment, the function module 120 includes an image capturing device for a photo function or a video function. In an embodiment, the function module 120 is used as a back camera at the first position, and is used as a front camera at the second position. In an embodiment, the angle difference between the first position and the second position is 180 degrees. In other words, the function module 120 rotates by 180 degrees from the first position to the second position.

Figure 3:
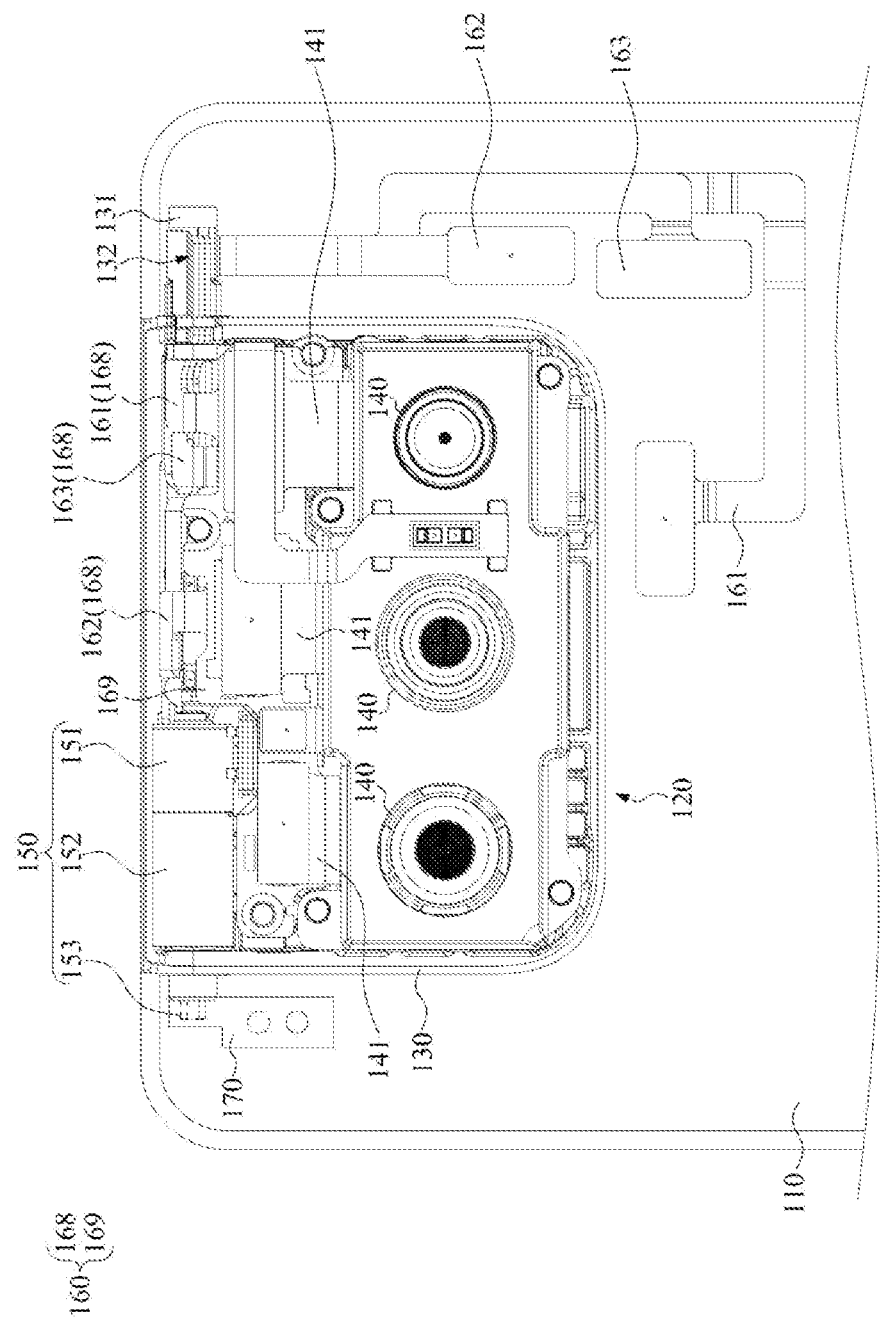
FIG. 3 is a rear perspective view of the electronic device shown in FIG. 1.

Please refer to FIG. 3. The function module 120 includes a housing 130, a function component 140, a moto assembly 150 and a rigid-flex circuit board 160. The function component 140 is disposed at the housing 130. The function component 140 includes at least one of an image capturing device (including a photosensitive element and a camera), a flashlight, a speaker or a telephone receiver to provide the functions of taking a photo, a video or playing/receiving sound. The moto assembly 150 is disposed in the housing 130. The moto assembly 150 includes a moto 151, a power transmission module 152 and an output shaft 153. The moto 151 is a power source. The power transmission module 152 is connected between the moto 151 and the output shaft 153. In an embodiment, the power transmission module 152 transfers the output of the moto 151 to the output shaft 153. In an embodiment, the power transmission module 152 is a gearbox.

As shown in FIG. 3, the output shaft 153 protrudes from a side of the housing 130 and is fixed to the body 110. Therefore, the moto 151 drives the function module 120 to rotate relative to the body 110. In detail, the moto 151 includes two parts (that is, a stator and a rotor) rotating relative to each other, which are connected to the output shaft 153 and the housing 130, respectively. When the function module 120 is not installed in the body 110, the output shaft 153 rotates freely relative to the housing 130 when the output shaft 153 is driven by the moto 151. When the function module 120 is installed in the body 110, the part of the moto 151 connected to the housing 130 is used as the stator, and the part of the moto 151 connected to the output shaft 153 is used as the rotor. At this time, since the output shaft 153 is fixed to the body 110 and does not rotate freely, the part of the moto 151 connected to the housing 130 rotates to drive the housing 130 to rotate around the output shaft 153. As a result, the function module 120 rotates.

As shown in FIG. 3, in some embodiments, the electronic device 100 further includes a shaft sleeve 170. The shaft sleeve 170 is disposed in the body 110 (for example, the shaft sleeve 170 is locked to the body 110 via a screw). In an embodiment, the shaft sleeve 170 is fixedly sleeved to a section of the output shaft 153 protruding from the left side of the housing 130 to fix the output shaft 153 to the body 110. In some embodiments, the output shaft 153 is connected to the housing 130 via a bearing (not shown), to enable the housing 130 to rotate relative to the output shaft 153 which is fixed to the body 110.

As shown in FIG. 3, the housing 130 includes a shaft portion 131. The shaft portion 131 is disposed at a side of the housing 130 opposite to the output shaft 153 of the moto assembly 150. The shaft portion 131 is rotatably engaged to the body 110. The rigid-flex circuit board 160 is disposed in the housing 130. The rigid-flex circuit board 160 includes a rigid board portion 169 and at least one bendable flexible board portion 168. The rigid board portion 169 is fixed to the housing 130 (for example, the rigid board portion 169 is locked to the housing 130 via a screw) and electrically connected to the function component 140 or the moto assembly 150. The flexible board portion 168 is connected to the rigid board portion 169. The flexible board portion 168 passes through the shaft portion 131 of the housing 130 and extends to outside of the housing 130. The flexible board portion 168 passes through the shaft portion 131 and extends into the body 110 to be connected to the internal electronic components (such as a mainboard, controllers or processors) of the body 110. In an embodiment, the flexible board portion 168 includes multilayer air gap flexible printed circuit (air gap FPC). The rigid board portion 169 is formed via the connection of multilayer flexible printed circuit.

The rigid-flex circuit board 160 is used as a transferring component between the internal electronic components of the body 110 and the function component 140 or the moto assembly 150. In some embodiments, the rigid-flex circuit board 160 includes power transmission lines to transmit power from the body 110 to the function component 140 or the moto assembly 150. In some embodiments, the rigid-flex circuit board 160 includes signal transmission lines to transmit electronic signals between the function component 140 and the internal electronic components of the body 110.

The rigid-flex circuit board 160 occupies small space. Thus, the volume of the function module 120 is easily decreased. Moreover, since the rigid-flex circuit board 160 is configured as the transferring component, the lines of the function component 140 (for example, the flexible printed circuit 141) do not need to be dragged out of the function module 120 to be connected to the internal electronic components of the body 110. Therefore, the function component 140 is not easily damaged in the process of rotating the function module 120.

In some embodiments, the function component 140 includes the flexible printed circuit 141 (FPC). The flexible printed circuit 141 is detachably connected to the rigid board portion 169. When the rigid-flex circuit board 160 is damaged due to the folding of the function module 120, the function component 140 is not easy to be damaged since the rigid-flex circuit board 160 is the transferring component. Therefore, only the rigid-flex circuit board 160 needs to be replaced, which decreases the maintenance cost.

Figure 4:
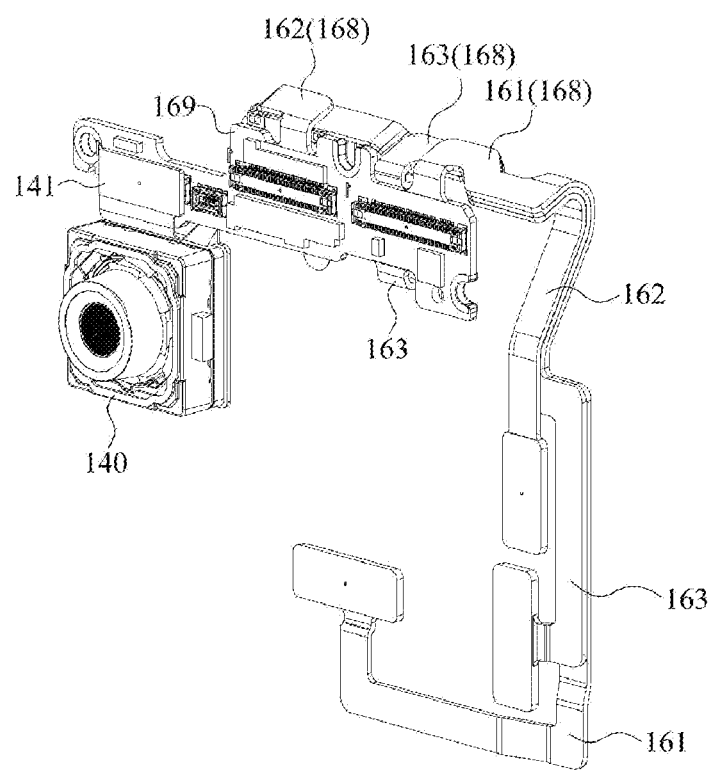
FIG. 4 is an enlarged view showing components of a function module shown in FIG. 3.

Please also refer to FIG. 4. In some embodiments, the rigid-flex circuit board 160 includes a first flexible board portion 161, a second flexible board portion 162 and a third flexible board portion 163. The first flexible board portion 161, the second flexible board portion 162 and the third flexible board portion 163 are bent and disposed in a stack. In some embodiments, the first flexible board portion 161, the second flexible board portion 162 and the third flexible board portion 163 are six-layer gap flexible printed circuits.

As shown in FIG. 3 and FIG. 4, the shaft portion 131 of the housing 130 includes an opening portion 132. The flexible board portion 168 (including the first flexible board portion 161, the second flexible board portion 162 and the third flexible board portion 163) passes through the opening portion 132 and extends into the body 110. In some embodiments, the first flexible board portion 161, the second flexible board portion 162 and the third flexible board portion 163 are superimposed and pass through the shaft portion 131. Since the first flexible board portion 161, the second flexible board portion 162 and the third flexible board portion 163 are superimposed at one side of the housing 130, the space for the outgoing lines of the flexible board portion 168 and rotation of the flexible board portion 168 is decreased. As a result, the space at another side of the housing 130 is available for the moto assembly 150 to drive the function module 120 to rotate.

Figure 5:
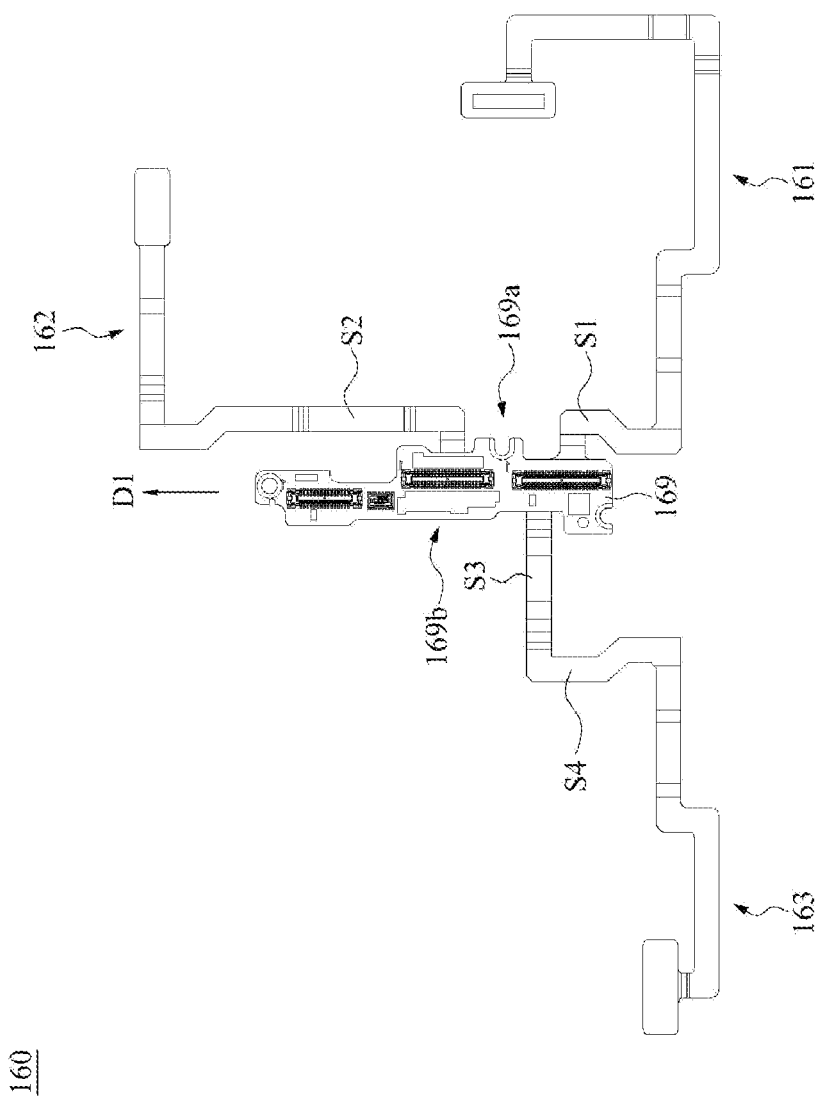
FIG. 5 is a schematic diagram showing a rigid-flex circuit board shown in FIG. 4 in an open state.

Please also refer to FIG. 5. The rigid-flex circuit board 160 is unfolded to a planar structure. The rigid board portion 169 includes a first side 169a and a second side 169b opposite to each other. The first flexible board portion 161 and the second flexible board portion 162 extend from the first side 169a. The third flexible board portion 163 extends from the second side 169b. In the direction of D1, the third flexible board portion 163 is connected to one end of the rigid board portion 169, which is between the end of the first flexible board portion 161 connected to the rigid board portion 169 and the end of the second flexible board portion 162 connected to the rigid board portion 169.

As shown in FIG. 5, the first flexible board portion 161 includes a first section S1, and the second flexible board portion 162 includes a second section S2. When the rigid-flex circuit board 160 is fully unfolded, the first section S1 and the second section S2 extend towards opposite directions. As shown in FIG. 4, the second section S2 is folded reversely and then superimposed with the first section S1, and then the first flexible board portion 161 and the second flexible board portion 162 are superimposed and pass through the shaft portion 131.

As shown in FIG. 5, the third flexible board portion 163 includes a third section S3 and a fourth section S4. The two ends of the third section S3 are connected to the rigid board portion 169 and the fourth section S4, respectively. The fourth section S4 and the first section S1 extend towards the same direction. As shown in FIG. 4, when the third section S3 is folded reversely, the fourth section S4 is superimposed with the first section S1 of the first flexible board portion 161 and the second section S2 of the second flexible board portion 162. Therefore, the first flexible board portion 161, the second flexible board portion 162 and the third flexible board portion 163 are superimposed together and pass through the shaft portion 131.

Figure 6:
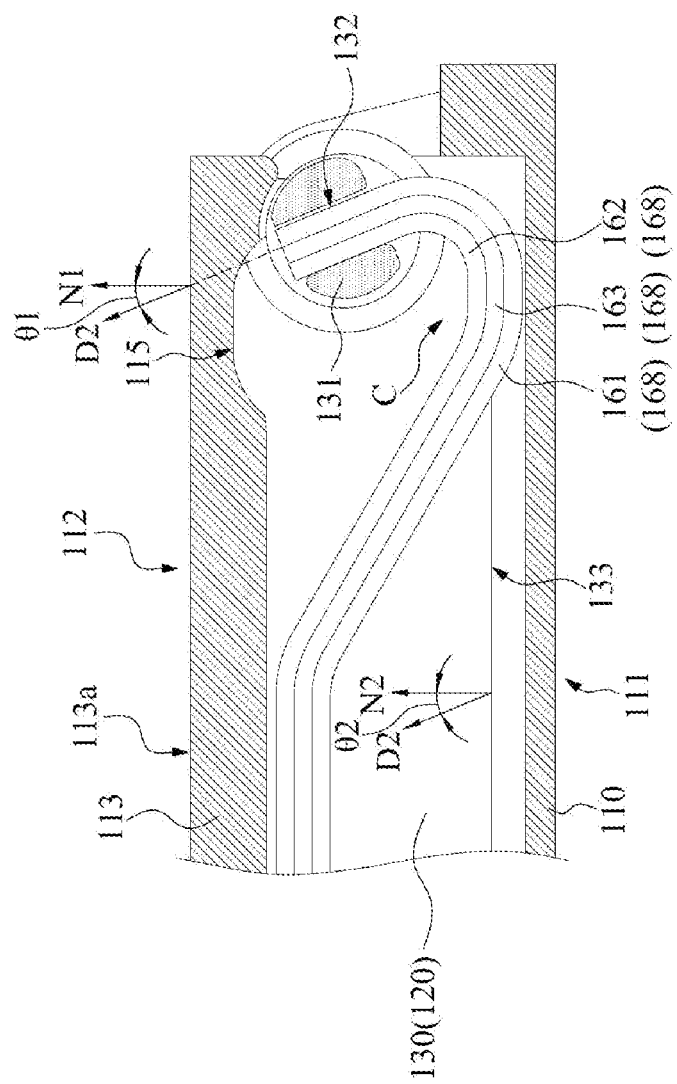
FIG. 6 and FIG. 7 show partial enlarged cross-sectional views of the electronic devices shown in FIG. 1 and FIG. 2, respectively, with a cross-section passing through a shaft portion of a function module.

Please refer to FIG. 6, in some embodiments, the opening portion 132 passes through the shaft portion 131 along a radial direction. When the function module 120 is in the slot 114 of the cover 113 (that is, when the function module 120 is at the first position), the opening portion 132 is inclined relative to the normal direction N1 of the back side 113a of the cover 113. The flexible board portion 168 passes through the opening portion 132. The flexible board portion 168 extends from the end of the opening portion 132 far away from the back side 113a into the body 110 and is bent to form a notch C facing the cover 113.

Figure 7:
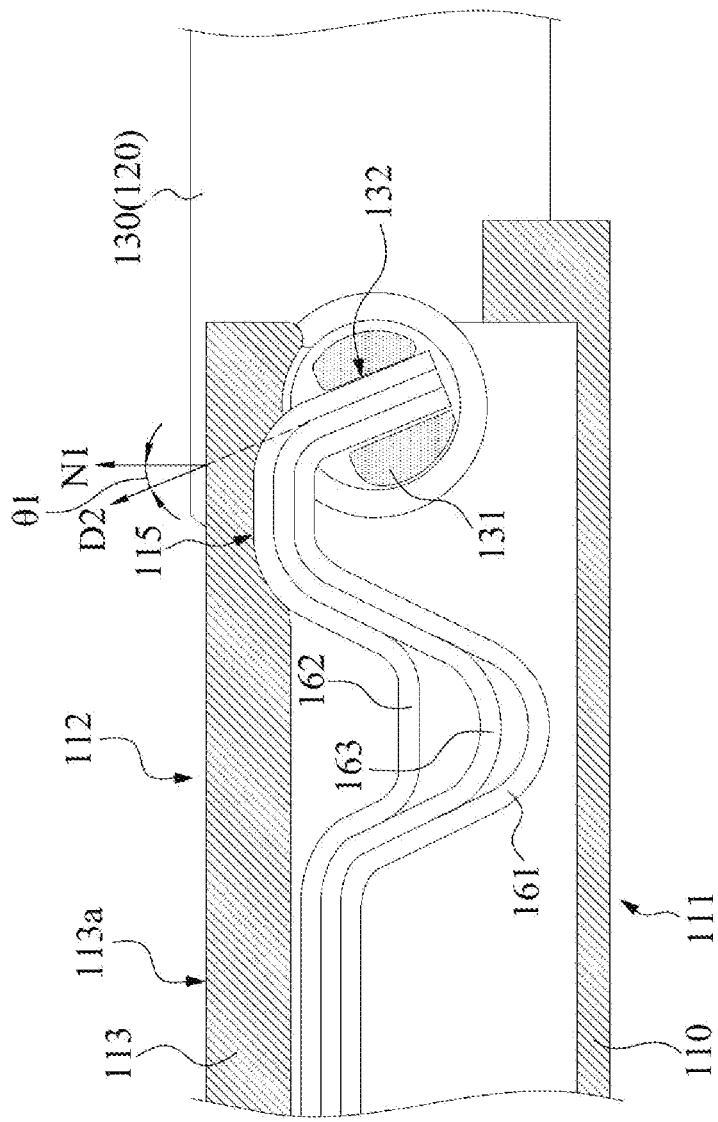

Please also refer to FIG. 7. When the function module 120 rotates to the second position shown in FIG. 7, the flexible board portion 168 is partly against the cover 113 and thus is bent. Since the opening portion 132 is inclined relative to the normal direction N1, when the function module 120 rotates to the second position, the flexible board portion 168 is not bent excessively. Consequently, the working life of the rigid-flex circuit board 160 is improved. Moreover, by controlling the inclining degree of the opening portion 132, the flexible board portion 168 moves in the left region of the shaft portion 131 when the function module 120 rotates from the first position to the second position. Therefore, the space at the right side of the shaft portion 131 (for example, corresponding to the top of the electronic device 100) for the rotation of the flexible board portion 168 is not needed. As a result, the height of the electronic device 100 is decreased.

As shown in FIG. 6 and FIG. 7, in some embodiments, when the function module 120 is at the first position or the second position, the angle between the inclining direction D2 of the opening portion 132 and the normal direction is θ 1. The angle θ 1 is larger than 0 degree and is smaller than or equal to 30 degrees. In some embodiments, the angle θ 1 is 22.5 degrees.

As shown in FIG. 6 and FIG. 7, in some embodiments, the cover 113 includes a recess 115. The recess 115 faces the shaft portion 131 of the housing 130 and accommodates the flexible board portion 168. With the recess 115, the thickness of the electronic device 100 is decreased while enough rotating space is provided for the flexible board portion 168.

As shown in FIG. 6, as for the structure of the function module 120, the opening portion 132 is inclined relative to the normal direction N2 of the bottom surface 133 of the function module 120, and the flexible board portion 168 is partly in the opening portion 132. In other words, the flexible board portion 168 is inclined relative to the normal direction N2 and extends through the shaft portion 131. In some embodiments, the angle between the inclining direction opening portion 132 and the normal direction N2 is θ 2. The angle θ 2 is larger than 0 degree and is smaller than or equal to 30 degrees. In some embodiments, the angle θ 2 is 22.5 degrees.

As shown in FIG. 6, in some embodiments, when the function module 120 is at the first position, the bottom surface 133 of the housing 130 is parallel to the back side 113a of the cover 113. Thus, the angles θ 1 and θ 2 are equal.

In summary, the function module of the electronic device includes the rigid-flex circuit board used as a transferring component between the function component and the mainboard of the electronic device. The rigid-flex circuit board occupies less space. The volume of the function module is easily decreased. Moreover, since the rigid-flex circuit board is configured as the transferring component, lines of the function component out of the function module do not need to be dragged out to be connected to the mainboard. Therefore, the function component is not easily damaged due to the rotation of the function module.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A function module for an electronic device, the function module comprising:
   a housing, including a shaft portion, wherein the shaft portion is rotatably coupled to the housing;
   a function component, disposed at the housing; and
   a rigid-flex circuit board, disposed in the housing, the rigid-flex circuit board including:
      a rigid board portion, electrically connected to the function component; and
      a flexible board portion, connected to the rigid board portion, passing through the shaft portion and extending to outside of the housing, such that the flexible board portion deforms from a first shape into a second shape when the shaft portion rotates from a first position to a second position.

2. The function module according to claim 1, wherein the flexible board portion includes a first flexible board portion and a second flexible board portion, and the first flexible board portion and the second flexible board portion are superimposed and passing through the shaft portion.

3. The function module according to claim 2, wherein the first flexible board portion includes a first section, the second flexible board portion includes a second section, the second section is folded reversely and is superimposed with the first section.

4. A function module for an electronic device, the function module comprising:
   a housing, including a shaft portion and a bottom surface, wherein the shaft portion includes an opening portion and is rotatably coupled to the housing, the opening portion passes through the shaft portion along a radial direction and is inclined relative to a normal direction of the bottom surface;
   a function component, disposed at the housing; and
   a rigid-flex circuit board, disposed in the housing, the rigid-flex circuit board including:
      a rigid board portion, electrically connected to the function component; and
      a flexible board portion, connected to the rigid board portion, passing through the shaft portion and extending to outside of the housing, such that the flexible board portion deforms from a first shape into a second shape when the shaft portion rotates from a first position to a second position, wherein the flexible board portion is partly in the opening portion.

5. The function module according to claim 4, wherein an angle is between an inclining direction of the opening portion and the normal direction of the bottom surface, and the angle is larger than 0 degree and smaller than or equal to 30 degrees.

6. An electronic device, comprising:
a body; and
a function module, rotatably disposed in the body, the function module including
a housing, including a shaft portion, the shaft portion is rotatably engaged to the body;
a function component, disposed at the housing; and
a rigid-flex circuit board, disposed in the housing, the rigid-flex circuit board including:
a rigid board portion, electrically connected to the function component; and
at least a flexible board portion, connected to the rigid board portion, and passing through the shaft portion and extending into the body, such that the at least a flexible board portion deforms from a first shape into a second shape when the shaft portion rotates from a first position to a second position.

7. The electronic device according to claim 6, wherein the flexible board portion includes a first flexible board portion and a second flexible board portion, and the first flexible board portion and the second flexible board portion are superimposed and passing through the shaft portion.

8. The electronic device according to claim 7, wherein the first flexible board portion includes a first section, the second flexible board portion includes a second section, the second section is folded reversely and is superimposed with the first section.

9. The electronic device according to claim 6, wherein the body includes a cover, the cover includes a slot, the slot is configured to accommodate the function module, the shaft portion includes an opening portion, the opening portion passes through the shaft portion along a radial direction, when the function module is in the slot, the opening portion is inclined relative to a normal direction of a back side of the cover, the flexible board portion passes through the opening portion and extends into the body from an end of the opening portion far away from the back side.

10. The electronic device according to claim 9, wherein an angle is between an inclining direction of the opening portion and the normal direction of the back side, and the angle is larger than 0 degree and is smaller than or equal to 30 degrees.

* * * * *